US012718862B2

(12) United States Patent
Cowles et al.

(10) Patent No.: US 12,718,862 B2
(45) **Date of Patent: *Aug. 25, 2026**

(54) APPARATUSES AND METHODS FOR CONTROLLING STEAL RATES

(71) Applicant: Lodestar Licensing Group LLC, Evanston, IL (US)

(72) Inventors: Timothy B. Cowles, Boise, ID (US); Jiyun Li, Boise, ID (US); Beau D. Barry, Boise, ID (US); Matthew D. Jenkinson, Boise, ID (US); Nathaniel J. Meier, Boise, ID (US); Michael A. Shore, Boise, ID (US); Adam J. Grenzebach, Boise, ID (US); Dennis G. Montierth, Meridian, ID (US)

( * ) Notice: Subject to any disclaimer, the term of this patent is extended or adjusted under 35 U.S.C. 154(b) by 160 days.

This patent is subject to a terminal disclaimer.

(21) Appl. No.: 18/467,097

(22) Filed: Sep. 14, 2023

(65) Prior Publication Data

US 2024/0062798 A1 Feb. 22, 2024

Related U.S. Application Data

(63) Continuation of application No. 17/347,957, filed on Jun. 15, 2021, now Pat. No. 11,798,610, which is a (Continued)

(51) Int. Cl.
*G11C 11/401* (2006.01)
*G11C 11/406* (2006.01)
(Continued)

(52) U.S. Cl.
CPC ... *G11C 11/40611* (2013.01); *G11C 11/40618* (2013.01); *G11C 11/4085* (2013.01); *G11C 11/4087* (2013.01); *G11C 8/08* (2013.01)

(58) Field of Classification Search
CPC ............ G11C 11/40611; G11C 11/402; G11C 11/40603; G11C 11/4091; G11C 11/4085;
(Continued)

(56) References Cited

U.S. PATENT DOCUMENTS 5,225,839 A 7/1993 Okurowski et al.
5,299,159 A 3/1994 Balistreri et al.
(Continued)

FOREIGN PATENT DOCUMENTS

BE 825677 A 8/1975
CN 1841551 A 10/2006
(Continued)

OTHER PUBLICATIONS

International Search Report & Written Opinion dated Aug. 28, 2020 for PCT Application No. PCT/US2020/032931, pp. all.
(Continued)

*Primary Examiner* — Mushfique Siddique
(74) *Attorney, Agent, or Firm* — Dorsey & Whitney LLP

(57) ABSTRACT

An apparatus may include a refresh control circuit with multiple timing circuits. The timing circuits may be used to control steal rates, e.g., the rate of refresh time slots dedicated to healing victim word lines of row hammers. The timing circuits may be controlled to allow independent adjustment of the steal rates for different victim word lines. Thus, different victim word lines may be refreshed at different rates and the different rates may be independent of one another.

19 Claims, 6 Drawing Sheets

Related U.S. Application Data continuation of application No. 16/431,641, filed on Jun. 4, 2019, now Pat. No. 11,069,393.

(51) Int. Cl.
*G11C 11/408* (2006.01)
*G11C 8/08* (2006.01)

(58) Field of Classification Search
CPC ........... G11C 11/40618; G11C 11/4096; H01L 27/108; H01L 27/10805
See application file for complete search history.

(56) References Cited

U.S. PATENT DOCUMENTS 5,654,929 A 8/1997 Mote
5,699,297 A 12/1997 Yamazaki et al.
5,867,442 A 2/1999 Kim et al.
5,933,377 A 8/1999 Hidaka
5,943,283 A 8/1999 Wong et al.
5,956,288 A 9/1999 Bermingham et al.
5,959,923 A 9/1999 Matteson et al.
5,970,507 A 10/1999 Kato et al.
5,999,471 A 12/1999 Choi
5,999,473 A 12/1999 Harrington et al.
6,002,629 A 12/1999 Kim et al.
6,011,734 A 1/2000 Pappert
6,061,290 A 5/2000 Shirley
6,064,621 A 5/2000 Tanizaki et al.
6,212,118 B1 4/2001 Fujita
6,298,413 B1 10/2001 Christenson
6,306,721 B1 10/2001 Teo et al.
6,310,806 B1 10/2001 Higashi et al.
6,310,814 B1 10/2001 Hampel et al.
6,363,024 B1 3/2002 Fibranz
6,392,952 B1 5/2002 Chen et al.
6,424,582 B1 7/2002 Ooishi
6,434,064 B2 8/2002 Nagai
6,452,868 B1 9/2002 Fister
6,490,216 B1 12/2002 Chen et al.
6,515,928 B2 2/2003 Sato et al.
6,535,950 B1 3/2003 Funyu et al.
6,535,980 B1 3/2003 Kumar et al.
6,563,757 B2 5/2003 Agata
6,567,340 B1 5/2003 Nataraj et al.
6,950,364 B2 9/2005 Kim
6,977,824 B1 12/2005 Yang et al.
7,002,868 B2 2/2006 Takahashi
7,057,960 B1 6/2006 Fiscus et al.
7,061,225 B2 6/2006 Yang et al.
7,061,780 B2 6/2006 Yang et al.
7,082,070 B2 7/2006 Hong
7,187,607 B2 3/2007 Koshikawa et al.
7,203,113 B2 4/2007 Takahashi et al.
7,203,115 B2 4/2007 Eto et al.
7,209,402 B2 4/2007 Shinozaki et al.
7,215,588 B2 5/2007 Lee
7,444,577 B2 10/2008 Best et al.
7,551,502 B2 6/2009 Dono et al.
7,565,479 B2 7/2009 Best et al.
7,692,993 B2 4/2010 Iida et al.
7,830,742 B2 11/2010 Han
8,174,921 B2 5/2012 Kim et al.
8,400,805 B2 3/2013 Yoko
8,526,260 B2 9/2013 Pyeon
8,572,423 B1 10/2013 Isachar et al.
8,625,360 B2 1/2014 Iwamoto et al.
8,681,578 B2 3/2014 Narui
8,756,368 B2 6/2014 Best et al.
8,811,100 B2 8/2014 Ku
8,862,973 B2 10/2014 Zimmerman et al.
8,938,573 B2 1/2015 Greenfield et al.
9,032,141 B2 5/2015 Bains et al.
9,047,978 B2 6/2015 Bell et al.
9,076,499 B2 7/2015 Schoenborn et al.
9,076,548 B1 7/2015 Park et al.
9,087,602 B2 7/2015 Youn et al.
9,117,544 B2 8/2015 Bains et al.
9,123,447 B2 9/2015 Lee et al.
9,153,294 B2 10/2015 Kang
9,190,137 B2 11/2015 Kim et al.
9,190,139 B2 11/2015 Jung et al.
9,236,110 B2 1/2016 Bains et al.
9,251,885 B2 2/2016 Greenfield et al.
9,286,964 B2 3/2016 Halbert et al.
9,299,400 B2 3/2016 Bains et al.
9,311,984 B1 4/2016 Hong et al.
9,311,985 B2 4/2016 Lee et al.
9,324,398 B2 4/2016 Jones et al.
9,384,821 B2 7/2016 Bains et al.
9,390,782 B2 7/2016 Best et al.
9,396,786 B2 7/2016 Yoon et al.
9,406,358 B1 8/2016 Lee
9,412,432 B2 8/2016 Narui et al.
9,418,723 B2 8/2016 Chishti et al.
9,424,907 B2 8/2016 Fujishiro
9,478,316 B1 10/2016 Ryu
9,484,079 B2 11/2016 Lee
9,514,850 B2 12/2016 Kim
9,570,143 B2 2/2017 Lim et al.
9,570,201 B2 2/2017 Morgan et al.
9,640,242 B1 5/2017 Lo et al.
9,646,672 B1 5/2017 Kim et al.
9,653,139 B1 5/2017 Park
9,672,889 B2 6/2017 Lee et al.
9,685,240 B1 6/2017 Park
9,691,466 B1 6/2017 Kim
9,697,913 B1 7/2017 Mariani et al.
9,734,887 B1 8/2017 Tavva
9,741,409 B2 8/2017 Jones et al.
9,741,421 B1 8/2017 Hedden
9,741,447 B2 8/2017 Akamatsu
9,747,971 B2 8/2017 Bains et al.
9,761,297 B1 9/2017 Tomishima
9,786,351 B2 10/2017 Lee et al.
9,799,391 B1 10/2017 Wei
9,805,782 B1 10/2017 Liou
9,805,783 B2 10/2017 Ito et al.
9,812,185 B2 11/2017 Fisch et al.
9,818,469 B1 11/2017 Kim et al.
9,831,003 B2 11/2017 Sohn et al.
9,865,326 B2 1/2018 Bains et al.
9,865,328 B1 1/2018 Desimone et al.
9,892,779 B2 2/2018 Kang et al.
9,922,694 B2 3/2018 Akamatsu
9,928,896 B1 3/2018 Kim et al.
9,934,143 B2 4/2018 Bains et al.
9,953,696 B2 4/2018 Kim
9,972,377 B2 5/2018 Oh et al.
9,978,430 B2 5/2018 Seo et al.
10,003,328 B1 6/2018 Yin et al.
10,020,045 B2 7/2018 Riho
10,020,046 B1 7/2018 Uemura
10,032,501 B2 7/2018 Ito et al.
10,049,716 B2 8/2018 Proebsting
10,083,737 B2 9/2018 Bains et al.
10,090,038 B2 10/2018 Shin
10,134,461 B2 11/2018 Bell et al.
10,141,042 B1 11/2018 Richter
10,147,472 B2 12/2018 Jones et al.
10,153,031 B2 12/2018 Akamatsu
10,170,174 B1 1/2019 Ito et al.
10,192,608 B2 1/2019 Morgan
10,210,925 B2 2/2019 Bains et al.
10,297,305 B1 5/2019 Moon et al.
10,297,307 B1 5/2019 Raad et al.
10,339,994 B2 7/2019 Ito et al.
10,381,327 B2 8/2019 Ramachandra et al.
10,418,978 B1 9/2019 Au Yeung et al.
10,446,256 B2 10/2019 Ong et al.
10,468,076 B1 11/2019 He et al.
10,490,250 B1 11/2019 Ito et al.
10,490,251 B2 11/2019 Wolff
10,504,577 B1 12/2019 Alzheimer

(56) References Cited

U.S. PATENT DOCUMENTS 10,510,396 B1 12/2019 Notani et al.
10,572,377 B1 2/2020 Zhang et al.
10,573,370 B2 2/2020 Ito et al.
10,607,679 B2 3/2020 Nakaoka
10,672,449 B2 6/2020 Ito et al.
10,685,696 B2 6/2020 Brown et al.
10,699,796 B2 6/2020 Benedict et al.
10,790,005 B1 9/2020 He et al.
10,825,505 B2 11/2020 Rehmeyer
10,832,792 B1 11/2020 Penney et al.
10,930,335 B2 2/2021 Bell et al.
10,943,636 B1 3/2021 Wu et al.
10,950,289 B2 3/2021 Ito et al.
10,957,377 B2 3/2021 Noguchi
10,964,378 B2 3/2021 Ayyapureddi et al.
10,978,132 B2 4/2021 Rehmeyer et al.
11,017,833 B2 5/2021 Wu et al.
11,062,754 B2 7/2021 Ito et al.
11,069,393 B2 7/2021 Cowles et al.
11,081,160 B2 8/2021 Ito et al.
11,222,683 B2 1/2022 Rehmeyer
11,222,686 B1 1/2022 Noguchi
11,227,649 B2 1/2022 Meier et al.
11,264,079 B1 3/2022 Roberts
11,302,374 B2 4/2022 Jenkinson et al.
11,302,377 B2 4/2022 Li et al.
11,309,010 B2 4/2022 Ayyapureddi
11,309,012 B2 4/2022 Meier et al.
11,315,619 B2 4/2022 Wolff
11,315,620 B2 4/2022 Ishikawa et al.
11,320,377 B2 5/2022 Chen et al.
11,348,631 B2 5/2022 Wu et al.
11,380,382 B2 7/2022 Zhang et al.
11,386,946 B2 7/2022 Ayyapureddi et al.
11,417,383 B2 8/2022 Jenkinson et al.
11,532,346 B2 12/2022 Brown et al.
11,557,331 B2 1/2023 Mitsubori et al.
11,610,622 B2 3/2023 Rehmeyer et al.
11,615,831 B2 3/2023 Yamamoto
11,626,152 B2 4/2023 Wu et al.
11,688,452 B2 6/2023 Nale et al.
11,715,512 B2 8/2023 Li et al.
11,749,331 B2 9/2023 Wu et al.
11,798,610 B2 10/2023 Cowles et al.
11,810,612 B2 11/2023 Roberts
11,935,576 B2 3/2024 Ishikawa et al.
11,955,158 B2 4/2024 Brown et al.
12,002,501 B2 6/2024 Noguchi
12,112,787 B2 10/2024 He et al.
12,125,514 B2 10/2024 Suzuki
2001/0008498 A1 7/2001 Ooishi
2002/0026613 A1 2/2002 Niiro
2002/0181301 A1 12/2002 Takahashi et al.
2002/0191467 A1 12/2002 Matsumoto et al.
2003/0026161 A1 2/2003 Yamaguchi et al.
2003/0063512 A1 4/2003 Takahashi et al.
2003/0067825 A1 4/2003 Shimano et al.
2003/0081483 A1 5/2003 De et al.
2003/0123301 A1 7/2003 Jang et al.
2003/0161208 A1 8/2003 Nakashima et al.
2003/0193829 A1 10/2003 Morgan et al.
2003/0231540 A1 12/2003 Lazar et al.
2004/0004856 A1 1/2004 Sakimura et al.
2004/0008544 A1 1/2004 Shinozaki et al.
2004/0022093 A1 2/2004 Leo
2004/0024955 A1 2/2004 Patel
2004/0085835 A1 5/2004 Ahn et al.
2004/0114446 A1 6/2004 Takahashi et al.
2004/0130959 A1 7/2004 Kawaguchi
2004/0160838 A1 8/2004 Pelley et al.
2004/0184323 A1 9/2004 Mori et al.
2004/0218431 A1 11/2004 Chung et al.
2005/0002254 A1 1/2005 Otsuka et al.
2005/0002268 A1 1/2005 Otsuka et al.
2005/0041502 A1 2/2005 Perner
2005/0105362 A1 5/2005 Choi et al.
2005/0108460 A1 5/2005 David
2005/0213408 A1 9/2005 Shieh
2005/0243627 A1 11/2005 Lee et al.
2005/0249009 A1 11/2005 Shieh
2005/0265104 A1 12/2005 Remaklus et al.
2006/0018174 A1 1/2006 Park et al.
2006/0050591 A1 3/2006 Park
2006/0083099 A1 4/2006 Bae et al.
2006/0087903 A1 4/2006 Riho et al.
2006/0104139 A1 5/2006 Hur et al.
2006/0176744 A1 8/2006 Stave
2006/0198220 A1 9/2006 Yoon et al.
2006/0215474 A1 9/2006 Hokenmaler
2006/0233012 A1 10/2006 Sekiguchi et al.
2006/0262616 A1 11/2006 Chen
2006/0262617 A1 11/2006 Lee
2006/0268643 A1 11/2006 Schreck et al.
2007/0002651 A1 1/2007 Lee
2007/0008799 A1 1/2007 Dono et al.
2007/0014175 A1 1/2007 Min et al.
2007/0028068 A1 2/2007 Golding et al.
2007/0030746 A1 2/2007 Best et al.
2007/0033338 A1 2/2007 Tsern
2007/0033339 A1 2/2007 Best et al.
2007/0058462 A1 3/2007 Blodgett
2007/0106838 A1 5/2007 Choi
2007/0147154 A1 6/2007 Lee
2007/0165042 A1 7/2007 Yagi
2007/0171750 A1 7/2007 Oh
2007/0237016 A1 10/2007 Miyamoto et al.
2007/0263442 A1 11/2007 Cornwell et al.
2007/0268768 A1 11/2007 Kawakubo
2007/0297252 A1 12/2007 Singh
2008/0028137 A1 1/2008 Schakel et al.
2008/0028260 A1 1/2008 Oyagi et al.
2008/0031068 A1 2/2008 Yoo et al.
2008/0126893 A1 5/2008 Harrand et al.
2008/0130394 A1 6/2008 Dono et al.
2008/0181048 A1 7/2008 Han
2008/0212386 A1 9/2008 Riho
2008/0224742 A1 9/2008 Pomichter
2008/0253212 A1 10/2008 Iida et al.
2008/0253213 A1 10/2008 Sato et al.
2008/0266990 A1 10/2008 Loeffler
2008/0270683 A1 10/2008 Barth et al.
2008/0306723 A1 12/2008 De et al.
2008/0316845 A1 12/2008 Wang et al.
2009/0021999 A1 1/2009 Tanimura et al.
2009/0052264 A1 2/2009 Hong et al.
2009/0059641 A1 3/2009 Jeddeloh
2009/0073760 A1 3/2009 Betser et al.
2009/0147606 A1 6/2009 Daniel
2009/0161468 A1 6/2009 Fujioka
2009/0168571 A1 7/2009 Pyo et al.
2009/0185440 A1 7/2009 Lee
2009/0201752 A1 8/2009 Riho et al.
2009/0228739 A1 9/2009 Cohen et al.
2009/0251971 A1 10/2009 Futatsuyama
2009/0296510 A1 12/2009 Lee et al.
2010/0005217 A1 1/2010 Jeddeloh
2010/0005376 A1 1/2010 Laberge et al.
2010/0061153 A1 3/2010 Yen et al.
2010/0074042 A1 3/2010 Fukuda et al.
2010/0097870 A1 4/2010 Kim et al.
2010/0110809 A1 5/2010 Kobayashi et al.
2010/0110810 A1 5/2010 Kobayashi
2010/0124138 A1 5/2010 Lee et al.
2010/0128547 A1 5/2010 Kagami
2010/0131812 A1 5/2010 Mohammad
2010/0141309 A1 6/2010 Lee
2010/0157693 A1 6/2010 Iwai et al.
2010/0182862 A1 7/2010 Teramoto
2010/0182863 A1 7/2010 Fukiage
2010/0329069 A1 12/2010 Ito et al.
2011/0007592 A1 1/2011 Tashiro
2011/0026290 A1 2/2011 Noda et al.
2011/0055495 A1 3/2011 Remaklus et al.
2011/0069572 A1 3/2011 Lee et al.

(56) References Cited

U.S. PATENT DOCUMENTS

2011/0122987 A1 5/2011 Neyer
2011/0134715 A1 6/2011 Norman
2011/0170353 A1 7/2011 Nguyen
2011/0216614 A1 9/2011 Hosoe
2011/0225355 A1 9/2011 Kajigaya
2011/0299352 A1 12/2011 Fujishiro et al.
2011/0310648 A1 12/2011 Iwamoto et al.
2012/0014199 A1 1/2012 Narui
2012/0059984 A1 3/2012 Kang et al.
2012/0151131 A1 6/2012 Kilmer et al.
2012/0155173 A1 6/2012 Lee et al.
2012/0155206 A1 6/2012 Kodama et al.
2012/0213021 A1 8/2012 Riho et al.
2012/0254472 A1 10/2012 Ware et al.
2012/0287727 A1 11/2012 Wang
2012/0307582 A1 12/2012 Marumoto et al.
2012/0327734 A1 12/2012 Sato
2013/0003467 A1 1/2013 Klein
2013/0003477 A1 1/2013 Park et al.
2013/0028034 A1 1/2013 Fujisawa
2013/0051157 A1 2/2013 Park
2013/0051171 A1 2/2013 Porter et al.
2013/0077423 A1 3/2013 Lee
2013/0173971 A1 7/2013 Zimmerman
2013/0254475 A1 9/2013 Perego et al.
2013/0279284 A1 10/2013 Jeong
2013/0304982 A1 11/2013 Jung et al.
2014/0006700 A1 1/2014 Schaefer et al.
2014/0006703 A1 1/2014 Bains et al.
2014/0006704 A1 1/2014 Greenfield et al.
2014/0013169 A1 1/2014 Kobla et al.
2014/0013185 A1 1/2014 Kobla et al.
2014/0016422 A1 1/2014 Kim et al.
2014/0022858 A1 1/2014 Chen et al.
2014/0043888 A1 2/2014 Chen et al.
2014/0050004 A1 2/2014 Mochida
2014/0078841 A1 3/2014 Chopra
2014/0078842 A1 3/2014 Oh et al.
2014/0089576 A1 3/2014 Bains et al.
2014/0089758 A1 3/2014 Kwok et al.
2014/0095780 A1 4/2014 Bains et al.
2014/0095786 A1 4/2014 Moon et al.
2014/0119091 A1 5/2014 You et al.
2014/0143473 A1 5/2014 Kim et al.
2014/0153315 A1 6/2014 Kwon et al.
2014/0156923 A1 6/2014 Bains et al.
2014/0169114 A1 6/2014 Oh
2014/0177370 A1 6/2014 Halbert et al.
2014/0181453 A1 6/2014 Jayasena et al.
2014/0185403 A1 7/2014 Lai
2014/0189228 A1 7/2014 Greenfield et al.
2014/0219042 A1 8/2014 Yu et al.
2014/0219043 A1 8/2014 Jones et al.
2014/0237307 A1 8/2014 Kobla et al.
2014/0241099 A1 8/2014 Seo et al.
2014/0254298 A1 9/2014 Dally
2014/0281206 A1 9/2014 Crawford et al.
2014/0281207 A1* 9/2014 Mandava ................ G11C 7/02 711/106
2014/0293725 A1 10/2014 Best et al.
2014/0321226 A1 10/2014 Pyeon
2015/0016203 A1 1/2015 Sriramagiri et al.
2015/0036445 A1 2/2015 Yoshida et al.
2015/0049566 A1 2/2015 Lee et al.
2015/0049567 A1 2/2015 Chi
2015/0055420 A1 2/2015 Bell et al.
2015/0078112 A1 3/2015 Huang
2015/0085564 A1 3/2015 Yoon et al.
2015/0089326 A1 3/2015 Joo et al.
2015/0092508 A1 4/2015 Bains
2015/0109871 A1 4/2015 Bains et al.
2015/0120999 A1 4/2015 Kim et al.
2015/0134897 A1 5/2015 Sriramagiri et al.
2015/0155025 A1 6/2015 Lee et al.
2015/0162064 A1 6/2015 Oh et al.
2015/0162067 A1 6/2015 Kim et al.
2015/0170728 A1 6/2015 Jung et al.
2015/0170733 A1 6/2015 Lee et al.
2015/0199126 A1 7/2015 Jayasena et al.
2015/0206572 A1 7/2015 Lim et al.
2015/0213872 A1 7/2015 Mazumder et al.
2015/0243339 A1 8/2015 Bell et al.
2015/0255140 A1 9/2015 Song
2015/0279441 A1 10/2015 Greenberg et al.
2015/0279442 A1 10/2015 Hwang
2015/0294711 A1 10/2015 Gaither et al.
2015/0340077 A1 11/2015 Akamatsu
2015/0356048 A1 12/2015 King
2015/0380073 A1 12/2015 Joo et al.
2016/0019940 A1 1/2016 Jang et al.
2016/0027498 A1 1/2016 Ware et al.
2016/0027531 A1 1/2016 Jones et al.
2016/0027532 A1 1/2016 Kim
2016/0042782 A1 2/2016 Narui et al.
2016/0070483 A1 3/2016 Yoon et al.
2016/0078846 A1 3/2016 Liu et al.
2016/0078911 A1 3/2016 Fujiwara et al.
2016/0085466 A1 3/2016 Benedict et al.
2016/0086649 A1 3/2016 Hong et al.
2016/0093402 A1 3/2016 Kitagawa et al.
2016/0125931 A1 5/2016 Doo et al.
2016/0133314 A1 5/2016 Hwang et al.
2016/0155491 A1 6/2016 Roberts et al.
2016/0180917 A1 6/2016 Chishti et al.
2016/0180921 A1 6/2016 Jeong
2016/0196863 A1 7/2016 Shin et al.
2016/0202926 A1 7/2016 Benedict
2016/0224262 A1 8/2016 Mandava et al.
2016/0225433 A1 8/2016 Bains et al.
2016/0239663 A1 8/2016 Healy et al.
2016/0336060 A1 11/2016 Shin
2016/0343423 A1 11/2016 Shido
2016/0352518 A1 12/2016 Ford et al.
2017/0011792 A1 1/2017 Oh et al.
2017/0047110 A1 2/2017 Kang et al.
2017/0052722 A1 2/2017 Ware et al.
2017/0062038 A1 3/2017 Doo et al.
2017/0076779 A1 3/2017 Bains et al.
2017/0092350 A1 3/2017 Halbert et al.
2017/0110177 A1 4/2017 Lee et al.
2017/0111792 A1 4/2017 Correia Fernandes et al.
2017/0117030 A1 4/2017 Fisch et al.
2017/0133085 A1 5/2017 Kim et al.
2017/0133108 A1 5/2017 Lee et al.
2017/0140807 A1 5/2017 Sun et al.
2017/0140810 A1 5/2017 Choi et al.
2017/0140811 A1 5/2017 Joo
2017/0146598 A1 5/2017 Kim et al.
2017/0148504 A1 5/2017 Saifuddin et al.
2017/0177246 A1 6/2017 Miller et al.
2017/0177505 A1 6/2017 Basak et al.
2017/0186481 A1 6/2017 Oh et al.
2017/0213586 A1 7/2017 Kang et al.
2017/0221546 A1 8/2017 Loh et al.
2017/0263305 A1 9/2017 Cho
2017/0264428 A1 9/2017 Seger, II
2017/0269861 A1 9/2017 Lu et al.
2017/0287547 A1 10/2017 Ito et al.
2017/0323675 A1 11/2017 Jones et al.
2017/0345482 A1 11/2017 Balakrishnan
2017/0352404 A1 12/2017 Lee et al.
2018/0005690 A1 1/2018 Morgan et al.
2018/0025770 A1 1/2018 Ito et al.
2018/0025772 A1 1/2018 Lee et al.
2018/0025773 A1 1/2018 Bains et al.
2018/0033479 A1 2/2018 Lea et al.
2018/0047110 A1 2/2018 Blackman et al.
2018/0061476 A1 3/2018 Kim
2018/0061483 A1 3/2018 Morgan
2018/0061485 A1 3/2018 Joo
2018/0075927 A1 3/2018 Jeong et al.
2018/0082736 A1 3/2018 Jung
2018/0082737 A1 3/2018 Lee
2018/0096719 A1 4/2018 Tomishima et al.

(56) References Cited

U.S. PATENT DOCUMENTS

2018/0102776 A1 4/2018 Chandrasekar et al.
2018/0107417 A1 4/2018 Shechter et al.
2018/0108401 A1 4/2018 Choi et al.
2018/0114561 A1 4/2018 Fisch et al.
2018/0114565 A1 4/2018 Lee
2018/0122454 A1 5/2018 Lee et al.
2018/0130506 A1 5/2018 Kang et al.
2018/0137005 A1 5/2018 Wu et al.
2018/0158504 A1 6/2018 Akamatsu
2018/0158507 A1 6/2018 Bang
2018/0182445 A1 6/2018 Lee et al.
2018/0190340 A1 7/2018 Kim et al.
2018/0218767 A1 8/2018 Wolff
2018/0226119 A1 8/2018 Kim et al.
2018/0233197 A1 8/2018 Laurent
2018/0240511 A1 8/2018 Yoshida et al.
2018/0247876 A1 8/2018 Kim et al.
2018/0254078 A1 9/2018 We et al.
2018/0261268 A1 9/2018 Hyun et al.
2018/0276150 A1 9/2018 Eckert et al.
2018/0285007 A1 10/2018 Franklin et al.
2018/0294028 A1 10/2018 Lee et al.
2018/0308539 A1 10/2018 Ito et al.
2018/0341553 A1 11/2018 Koudele et al.
2018/0342282 A1 11/2018 Morgan
2019/0013059 A1 1/2019 Akamatsu
2019/0043558 A1 2/2019 Suh et al.
2019/0051344 A1 2/2019 Bell et al.
2019/0051347 A1 2/2019 Lee
2019/0065087 A1 2/2019 Li et al.
2019/0066759 A1 2/2019 Nale
2019/0066766 A1 2/2019 Lee
2019/0088315 A1 3/2019 Saenz et al.
2019/0088316 A1 3/2019 Inuzuka et al.
2019/0103147 A1 4/2019 Jones et al.
2019/0115069 A1 4/2019 Lai
2019/0122722 A1 4/2019 Yamada et al.
2019/0122723 A1 4/2019 Ito et al.
2019/0129651 A1 5/2019 Wuu et al.
2019/0130960 A1 5/2019 Kim
2019/0130961 A1 5/2019 Bell et al.
2019/0139599 A1 5/2019 Ito et al.
2019/0147964 A1 5/2019 Yun et al.
2019/0161341 A1 5/2019 Howe
2019/0190341 A1 6/2019 Beisele et al.
2019/0196730 A1 6/2019 Imran
2019/0198078 A1 6/2019 Hoang et al.
2019/0198099 A1 6/2019 Mirichigni et al.
2019/0205253 A1 7/2019 Roberts
2019/0228810 A1 7/2019 Jones et al.
2019/0228815 A1 7/2019 Morohashi et al.
2019/0237131 A1 8/2019 Ito
2019/0237132 A1 8/2019 Morohashi
2019/0252020 A1 8/2019 Rios et al.
2019/0267077 A1 8/2019 Ito et al.
2019/0279706 A1 9/2019 Kim
2019/0294348 A1 9/2019 Ware et al.
2019/0333573 A1 10/2019 Shin et al.
2019/0347019 A1 11/2019 Shin et al.
2019/0348100 A1 11/2019 Smith et al.
2019/0348102 A1 11/2019 Smith et al.
2019/0348103 A1 11/2019 Jeong et al.
2019/0362774 A1* 11/2019 Kuramori ............ G11C 11/408
2019/0371390 A1 12/2019 Ito
2019/0385661 A1 12/2019 Koo et al.
2019/0385667 A1 12/2019 Morohashi et al.
2019/0385668 A1 12/2019 Fujioka et al.
2019/0385670 A1 12/2019 Notani et al.
2019/0386557 A1 12/2019 Wang et al.
2019/0391760 A1 12/2019 Miura et al.
2019/0392886 A1 12/2019 Cox et al.
2020/0005857 A1 1/2020 Ito et al.
2020/0051616 A1 2/2020 Cho
2020/0075086 A1 3/2020 Hou et al.
2020/0082873 A1 3/2020 Wolff
2020/0126611 A1 4/2020 Riho et al.
2020/0135263 A1 4/2020 Brown et al.
2020/0143871 A1 5/2020 Kim et al.
2020/0176050 A1 6/2020 Ito et al.
2020/0185026 A1 6/2020 Yun et al.
2020/0194050 A1 6/2020 Akamatsu
2020/0194056 A1 6/2020 Sakurai et al.
2020/0202921 A1 6/2020 Morohashi et al.
2020/0210278 A1 7/2020 Rooney et al.
2020/0211632 A1* 7/2020 Noguchi ........... G11C 11/40611
2020/0211633 A1 7/2020 Okuma
2020/0211634 A1 7/2020 Ishikawa et al.
2020/0219555 A1 7/2020 Rehmeyer
2020/0219556 A1 7/2020 Ishikawa et al.
2020/0265888 A1 8/2020 Ito et al.
2020/0273517 A1 8/2020 Yamamoto
2020/0273518 A1 8/2020 Raad et al.
2020/0279599 A1 9/2020 Ware et al.
2020/0294569 A1 9/2020 Wu et al.
2020/0294576 A1 9/2020 Brown et al.
2020/0321049 A1 10/2020 Meier et al.
2020/0381040 A1 12/2020 Penney et al.
2020/0388324 A1 12/2020 Rehmeyer et al.
2020/0388325 A1 12/2020 Cowles et al.
2020/0395063 A1 12/2020 Rehmeyer
2020/0402568 A1 12/2020 He et al.
2021/0057021 A1 2/2021 Wu et al.
2021/0057022 A1 2/2021 Jenkinson et al.
2021/0109577 A1 4/2021 Mandava et al.
2021/0118491 A1 4/2021 Li et al.
2021/0166752 A1 6/2021 Noguchi
2021/0183433 A1 6/2021 Jenkinson et al.
2021/0183435 A1 6/2021 Meier et al.
2021/0223852 A1 7/2021 Chang et al.
2021/0225431 A1 7/2021 Rehmeyer et al.
2021/0304813 A1 9/2021 Cowles et al.
2021/0335411 A1 10/2021 Wu et al.
2021/0350844 A1 11/2021 Morohashi et al.
2021/0406170 A1 12/2021 Jung et al.
2022/0051716 A1 2/2022 Ayyapureddi
2022/0059153 A1 2/2022 Zhang et al.
2022/0059158 A1 2/2022 Wu et al.
2022/0068361 A1 3/2022 Du et al.
2022/0091784 A1 3/2022 Brandl
2022/0093165 A1 3/2022 Mitsubori et al.
2022/0165328 A1 5/2022 Ishikawa et al.
2022/0189537 A1 6/2022 Kim
2022/0189539 A1 6/2022 Li et al.
2022/0199144 A1 6/2022 Roberts
2022/0199150 A1 6/2022 Song et al.
2022/0270670 A1 8/2022 Wu et al.
2022/0270672 A1 8/2022 Kim et al.
2023/0105151 A1 4/2023 Brown et al.
2023/0168818 A1 6/2023 You et al.
2023/0298654 A1 9/2023 Du et al.
2023/0352075 A1 11/2023 Suzuki
2023/0352076 A1 11/2023 He et al.
2024/0038288 A1 2/2024 Kim et al.
2024/0071460 A1 2/2024 Noguchi
2024/0339146 A1 10/2024 Kim
2025/0006243 A1 1/2025 He et al.
2025/0111045 A1 4/2025 Lee et al.
2025/0111872 A1 4/2025 Choi et al.
2025/0173255 A1 5/2025 Rooney

FOREIGN PATENT DOCUMENTS

CN 1879173 A 12/2006
CN 101026003 A 8/2007
CN 101038785 A 9/2007
CN 101047025 A 10/2007
CN 101067972 A 11/2007
CN 101075477 A 11/2007
CN 101091221 A 12/2007
CN 101211653 A 7/2008
CN 101217060 A 7/2008
CN 101243450 A 8/2008
CN 102301423 A 12/2011
CN 102663155 A 9/2012

(56) References Cited

FOREIGN PATENT DOCUMENTS

| | | | |
|---|---|---|---|
| CN | 102737706 | A | 10/2012 |
| CN | 102931187 | A | 2/2013 |
| CN | 104350546 | A | 2/2015 |
| CN | 104733035 | A | 6/2015 |
| CN | 104737234 | A | 6/2015 |
| CN | 104781885 | A | 7/2015 |
| CN | 104981874 | A | 10/2015 |
| CN | 105378847 | A | 3/2016 |
| CN | 105529047 | A | 4/2016 |
| CN | 106158005 | A | 11/2016 |
| CN | 106710621 | A | 5/2017 |
| CN | 106816169 | A | 6/2017 |
| CN | 107017016 | A | 8/2017 |
| CN | 107025927 | A | 8/2017 |
| CN | 107301874 | A | 10/2017 |
| CN | 107871516 | A | 4/2018 |
| CN | 107919150 | A | 4/2018 |
| CN | 108154895 | A | 6/2018 |
| CN | 108242248 | A | 7/2018 |
| CN | 108806740 | A | 11/2018 |
| CN | 109074305 | A | 12/2018 |
| CN | 109727624 | A | 5/2019 |
| CN | 109949844 | A | 6/2019 |
| CN | 110032897 | A | 7/2019 |
| CN | 110520929 | A | 11/2019 |
| CN | 110678925 | A | 1/2020 |
| CN | 110827884 | A | 2/2020 |
| CN | 111052243 | A | 4/2020 |
| CN | 111247586 | A | 6/2020 |
| CN | 111354393 | A | 6/2020 |
| CN | 111383682 | A | 7/2020 |
| CN | 114121076 | A | 3/2022 |
| JP | S6282887 | A | 4/1987 |
| JP | 2003085054 | A | 3/2003 |
| JP | 2005-216429 | A | 8/2005 |
| JP | 2011-258259 | A | 12/2011 |
| JP | 4911510 | B2 | 1/2012 |
| JP | 2013-004158 | A | 1/2013 |
| JP | 2014238903 | A | 12/2014 |
| JP | 6281030 | B1 | 1/2018 |
| KR | 20030063947 | A | 7/2003 |
| KR | 20070109104 | A | 11/2007 |
| KR | 20160134411 | A | 11/2016 |
| KR | 20170053373 | A | 5/2017 |
| KR | 20170093053 | A | 8/2017 |
| KR | 20180011642 | A | 2/2018 |
| KR | 20180081989 | A | 7/2018 |
| KR | 20180101647 | A | 9/2018 |
| KR | 20190046572 | A | 5/2019 |
| TW | 201801079 | A | 1/2018 |
| WO | 2014120477 | | 8/2014 |
| WO | 2015030991 | A1 | 3/2015 |
| WO | 2017171927 | A1 | 10/2017 |
| WO | 2019079157 | A1 | 4/2019 |
| WO | 2019083884 | A1 | 5/2019 |
| WO | 2019222960 | A1 | 11/2019 |
| WO | 2020010010 | A1 | 1/2020 |
| WO | 2020117686 | A1 | 6/2020 |
| WO | 2020247163 | A1 | 12/2020 |
| WO | 2020247639 | A1 | 12/2020 |

OTHER PUBLICATIONS

Kyungbae Park et al. "Experiments and Root Cause Analysis for Active-Precharge Hammering Fault in DDR3 SDRAM Under 3 X NM Technology";; Microelectronics Reliability: An Internet. Journal and World Abstracting Service; vol. 57, Dec. 23, 2015; pp. 39-46.

U.S. Appl. No. 18/064,773, filed Dec. 12, 2022 titled, "Apparatuses and Methods for Access Based Refresh Timing,"; pp. all pages of application as filed.

U.S. Appl. No. 18/356,502, titled "Refresh Modes for Performing Various Refresh Operation Types" filed Jul. 21, 2023; pp. all pages of application as filed.

U.S. Appl. No. 18/505,199, titled "Apparatuses and Methods for Distributed Targeted Refresh Operations" filed Nov. 9, 2023; pp. all pages of application as filed.

U.S. Appl. No. 17/175,485 titled "Apparatuses and Methods for Distributed Targeted Refresh Operations" filed Feb. 12, 2021; pp. all pages of application as filed.

Kim, et al. "Flipping Bits in MemoryWithout Accessing Them: An Experimental Study of DRAM Disturbance Errors" , IEEE, Jun. 2014; pp. all.

Anonymous: "Frequency—Wikipedia", Dec. 17, 2018, retrieved from URL: https://en.wikipedia.org/w/index.php?title=Frequency&oldid=874192848.

Kyungbae Park et al. "Experiments and Root Cause Anaylsis for Active-Precharge Hammering Fault in DDR3 SDRAM Under 3 X NM Technology"; Microelectronics Reliability: An Internet Journal and World Abstracting Service; vol. 57; Dec. 23, 2015; pp. 39-46.

* cited by examiner

APPARATUSES AND METHODS FOR CONTROLLING STEAL RATES

CROSS REFERENCE TO RELATED APPLICATION(S)

This application is a continuation of U.S. patent application Ser. No. 17/347,957 filed Jun. 15, 2021 and issued as U.S. Pat. No. 11,798,610 on Oct. 24, 2023, which is a continuation of U.S. patent application Ser. No. 16/431,641 filed Jun. 4, 2019 and issued as U.S. Pat. No. 11,069,393 on Jul. 20, 2021. The aforementioned applications, and issued patents, are incorporated herein by reference, in their entirety, for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. Typically, memory cells are arranged in an array that includes a series of rows referred to as word lines and columns referred to as bit lines. An auto-refresh operation may be carried out where the memory cells of one or more word lines are periodically refreshed to preserve data stored in the memory cells. Repeated access to a particular memory cell or group of memory cells, such as a word line, may cause an increased rate of data degradation in nearby memory cells (e.g., adjacent word lines). This repeated access is often referred to as a 'row hammer.' To preserve the data in nearby memory cells, the word lines of the nearby memory cells may need to be refreshed at a rate higher than a rate of the auto-refresh operations. However, extra refresh operations increase power consumption and may interfere with other memory operations. Accordingly, reducing extra refresh operations is desired.

DETAILED DESCRIPTION

Figure 1:
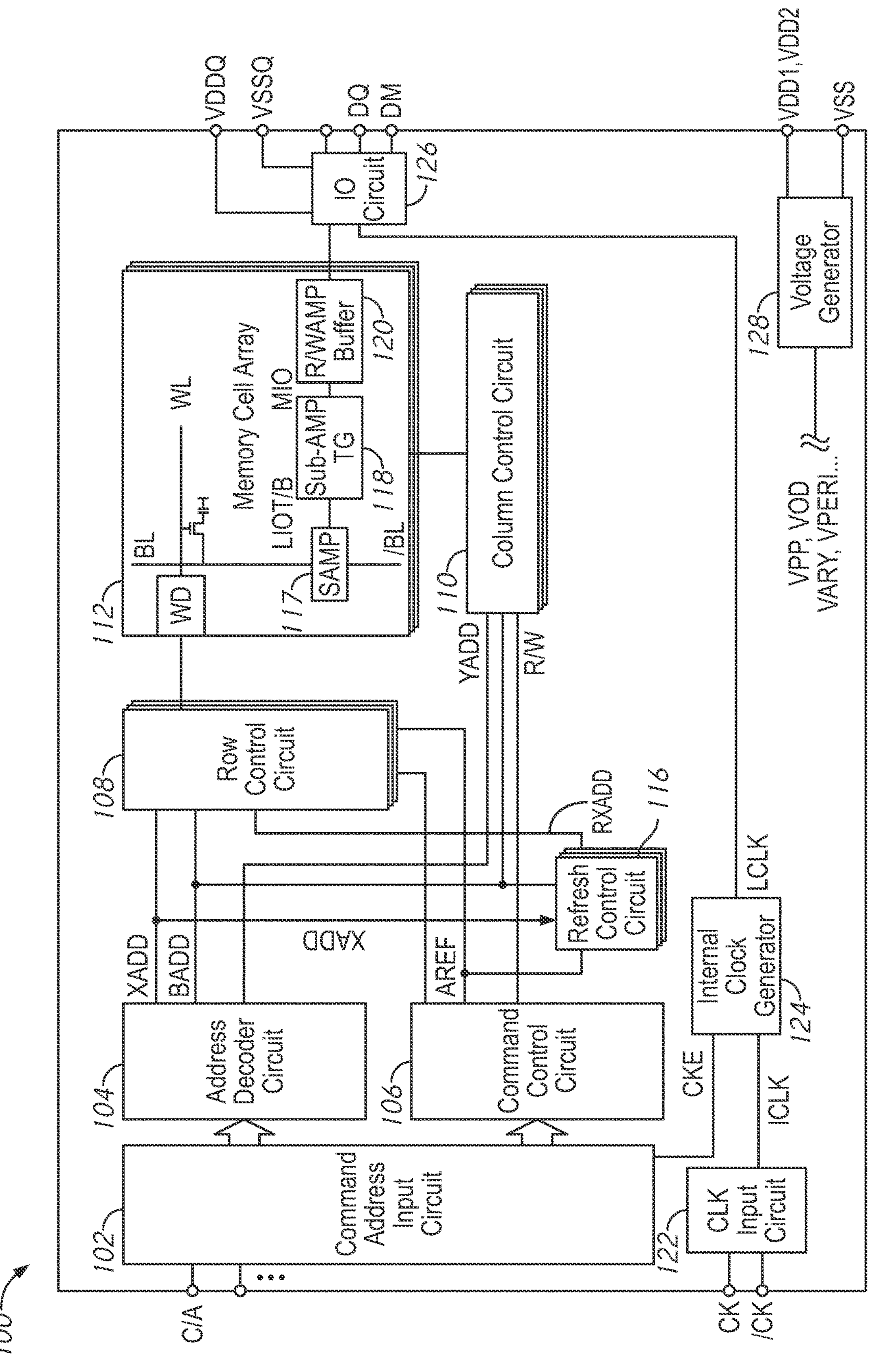
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a plurality of memory cells. The memory cells may store information (e.g., as one or more bits), and may be organized at the intersection of word lines (rows) and bit lines (columns). A number of word lines and bit lines may be organized into a memory bank. The memory device may include a number of different memory banks. The memory device may receive one or more command signals which may indicate operations in one or more of the banks of one or more memory packages. For example, the memory device may enter a refresh mode, in which word lines in one or more of the memory banks are refreshed.

Information in the memory cells may decay over time. The memory cells may be refreshed on a row-by-row (e.g., word line-by-word line) basis to preserve information in the memory cells. During a refresh operation, the information in one or more rows may be rewritten back to the respective word line to restore an initial value of the information. Repeated access to a given word line (e.g., an aggressor word line) may cause an increased rate of information decay in one or more neighboring word lines (e.g., victim word lines). In some applications, victim word lines may be considered to be the word lines which are physically adjacent to the aggressor word line. For example, victim word lines may be physically adjacent to the aggressor word line, that is, the victim word lines may be physically on either side of the aggressor word line (e.g., R+1 and R−1). In some embodiments, the word lines which are physically adjacent to the adjacent word lines (e.g., R+2 and R−2) may also be treated as victim word lines. In some applications, such as memories where word lines are densely spaced, more distant word lines may also be considered as victim word lines (e.g., R+3, R−3, R+4, R−4, etc.). Other relationships between victim and aggressor word lines may be used in other example embodiments.

Accesses to different word lines of the memory may be tracked in order to determine if a word line is an aggressor word line. For example, the row address of the accessed word lines and/or aggressor word lines may be stored in a register (e.g., file) or other storage device in the memory. If a word line is determined to be an aggressor word line, victim addresses associated with the victim word lines may be determined based, at least in part, on a row address of the aggressor word line. In some embodiments, the victim word lines (e.g., R+1, R−1, R+2, and R−2) may be refreshed as part of a targeted (or 'row hammer') refresh operation and thus there may be, for example, four victim addresses refreshed for each determined aggressor row address. A row address for a victim word line refreshed during a targeted refresh operation may be referred to as a targeted refresh address.

In some embodiments, some time slots for refresh operations may be reserved for auto-refresh operations and some time slots may be reserved for targeted refresh operations. In some embodiments, a targeted refresh address may be issued in a time slot which would otherwise have been assigned to an auto-refresh address (e.g., “steal”) if no row hammer management was needed. In some embodiments, certain refresh time slots may be reserved for targeted refresh addresses. These time slots may be referred to as targeted refresh time slots. The time period between time slots reserved for targeted refresh addresses may be referred to as the targeted refresh rate or steal rate.

Different victim word lines of an aggressor word line may not be affected in the same manner by a row hammer. For example, victim word lines closer to the aggressor word line (e.g., adjacent victim word lines. R+/−1) may suffer a higher rate of data degradation than more distant victim word lines (e.g., R+/−2). Accordingly, it may be desirable to perform targeted refresh operations on different victim word lines at different rates. For example, the R+/−1 victim word lines may be refreshed at four times the rate of the refreshing of R+/−2 victim word lines. In another example, the R+/−1 victim word lines may be refreshed at eight times the rate of the refreshing of R+/−2 victim word lines. In some applications, it may be desirable to be able to adjust the targeted refresh rate of the different victim word lines independently from one another. That is, the targeted refresh rate of R+/−2 may not depend on the targeted refresh rate of R+/−1. This may allow the targeted refresh rates for each type of victim word line to be optimized, which may reduce over-refreshing of the word lines.

The present disclosure is drawn to apparatuses and methods for controlling targeted refresh rates (e.g., steal rates). More specifically, the present disclosure is drawn to apparatuses and methods for independently controlling the steal rates for different victim word lines, such as victim word lines that have different physical distances from an aggressor word line. In some embodiments, a refresh control circuit may include two or more timing circuits to allow independent control of the steal rates for different victim word lines.

FIG. 1 is a block diagram showing an overall configuration of a semiconductor device according to at least one embodiment of the disclosure. The semiconductor device 100 may be a semiconductor memory device, such as a DRAM device integrated on a single semiconductor chip.

The semiconductor device 100 includes a memory array 112. In some embodiments, the memory array 112 may include of a plurality of memory banks. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row control circuit 108 and the selection of the bit lines BL and /BL is performed by a column control circuit 110. In some embodiments, there may be a row control circuit 108 and column control circuit 110 for each of the memory banks.

The bit lines BL and /BL are coupled to a respective sense amplifier (SAMP) 117. Read data from the bit line BL or /BL is amplified by the sense amplifier SAMP 117, and transferred to read/write amplifiers 120 over complementary local data lines (LIOT/B), transfer gate (TG) 118, and complementary main data lines (MIO). Conversely, write data outputted from the read/write amplifiers 120 is transferred to the sense amplifier 117 over the complementary main data lines MIO, the transfer gate 118, and the complementary local data lines LIOT/B, and written in the memory cell MC coupled to the bit line BL or BL.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 122. The external clocks may be complementary. The clock input circuit 122 generates an internal clock ICLK based on the CK and /CK clocks. The ICLK clock is provided to the command control circuit 106 and to an internal clock generator circuit 124. The internal clock generator circuit 124 provides various internal clocks LCLK based on the ICLK clock. The LCLK clocks may be used for timing operation of various internal circuits. The internal data clocks LCLK are provided to the input/output circuit 126 to time operation of circuits included in the input/output circuit 126, for example, to data receivers to time the receipt of write data.

The C/A terminals may be supplied with memory addresses. The memory addresses supplied to the C/A terminals are transferred, via a command/address input circuit 102, to an address decoder circuit 104. The address decoder circuit 104 receives the address and supplies a decoded row address XADD to the row control circuit 108 and supplies a decoded column address YADD to the column control circuit 110. The row address XADD may be used to specify one or more word lines WL of the memory array 112 and the column address YADD may specify one or more bit lines BL of the memory array 112. The address decoder circuit 104 may also provide a bank address BADD, which specifies a particular bank of the memory. The bank address BADD may be provided to the row control circuit 108 and/or column control circuit 110 to direct access operations to one or more of the banks. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and/or bank address BADD to indicate the memory cell(s) to be accessed.

The commands may be provided as internal command signals to a command control circuit 106 via the command/address input circuit 102. The command control circuit 106 includes circuits to decode the internal command signals to generate various internal signals and commands for performing operations. For example, the command control circuit 106 may provide a row command signal to select a word line and a column command signal to select a bit line.

The device 100 may receive an access command which is a row activation command ACT. When the row activation command ACT is received, a row address XADD is timely supplied with the row activation command ACT.

The device 100 may receive an access command which is a read command. When a read command is received, a bank address BADD and a column YADD address are timely supplied with the read command, read data is read from memory cells in the memory array 112 corresponding to the row address XADD and column address YADD. The read command is received by the command control circuit 106, which provides internal commands so that read data from the memory array 112 is provided to the read/write amplifiers 120. The read data is output to outside from the data terminals DQ via the input/output circuit 126.

The device 100 may receive an access command which is a write command. When the write command is received, a bank address and a column address are timely supplied with the write command, write data supplied to the data terminals DQ is written to a memory cells in the memory array 112 corresponding to the row address and column address. The write command is received by the command control circuit 106, which provides internal commands so that the write data is received by data receivers in the input/output circuit 126. Write clocks may also be provided to the external clock terminals for timing the receipt of the write data by the data receivers of the input/output circuit 126. The write data is supplied via the input/output circuit 126 to the read/write amplifiers 120, and by the read/write amplifiers 120 to the memory array 112 to be written into the memory cell MC.

The device 100 may also receive commands causing it to carry out refresh operations. A refresh signal AREF may be a pulse signal which is activated when the command control circuit 106 receives a signal which indicates a refresh command. In some embodiments, the refresh command may be externally issued to the memory device 100. In some embodiments, the refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at a desired internal timing. Thus, refresh operations may continue automatically. A self-refresh exit command may cause the automatic activation of the refresh signal AREF to stop and return to an IDLE state.

The refresh control circuit 116 supplies a refresh row address RXADD to the row control circuit 108, which may refresh one or more word lines WL indicated by the refresh row address RXADD. The refresh control circuit 116 may control a timing of the refresh operation based on the refresh signal AREF. In some embodiments, responsive to an activation of AREF, the refresh control circuit 116 may generate one or more activations of a pump signal, and may generate and provide a refresh address RXADD for each activation of the pump signal (e.g., each pump).

One type of refresh operation may be an auto-refresh operation. Responsive to an auto-refresh operation the memory bank may refresh a word line or a group of word lines of the memory, and then may refresh a next word line or group of word lines of the memory bank responsive to a next auto-refresh operation. The refresh control circuit 116 may provide an auto-refresh address as the refresh address RXADD which indicates a word line or a group of word lines in the memory bank. The refresh control circuit 116 may generate a sequence of refresh addresses RXADD such that over time the auto-refresh operation may cycle through all the word lines WL of the memory bank. The timing of refresh operations may be such that each word line is refreshed with a frequency based, at least in part, on a normal rate of data degradation in the memory cells (e.g., auto-refresh rate).

Another type of refresh operation may be a targeted refresh operation. As mentioned previously, repeated access to a particular word line of memory (e.g., an aggressor word line) may cause an increased rate of decay in neighboring word lines (e.g., victim word lines) due, for example, to electromagnetic coupling between the word lines. In some embodiments, the victim word lines may include word lines which are physically adjacent to the aggressor word line. In some embodiments, the victim word lines may include word lines further away from the aggressor word line. Information in the victim word line may decay at a rate such that data may be lost if they are not refreshed before the next auto-refresh operation of that word line. In order to prevent information from being lost, it may be necessary to identify aggressor word lines and then carry out a targeted refresh operation where a refresh address RXADD associated with one or more associated victim word lines is refreshed.

The refresh control circuit 116 may selectively output a targeted refresh address (e.g., a victim row address) or an automatic refresh address (e.g., auto-refresh address) as the refresh address RXADD. The auto-refresh addresses may be from a sequence of addresses which are provided based on activations of the auto-refresh signal AREF. The refresh control circuit 116 may cycle through the sequence of auto-refresh addresses at a rate determined by AREF. In some embodiments, the sequence of auto-refresh addresses may be generated by updating (e.g., incrementing) one or more portions of the previous auto-refresh address.

The refresh control circuit 116 may also determine targeted refresh addresses which are addresses that require refreshing (e.g., victim row addresses corresponding to victim word lines) based on the access pattern of nearby addresses (e.g., aggressor row addresses corresponding to aggressor word lines) in the memory array 112. The refresh control circuit 116 may selectively use one or more signals of the device 100 to calculate the refresh address RXADD. For example, the refresh address RXADD may be calculated based on the row addresses XADD provided by the address decoder circuit 104. The refresh control circuit 116 may receive the current value of the row address XADD provided by the address decoder circuit 104 and determine a targeted refresh address based on one or more of the received addresses XADD.

The refresh address RXADD may be provided with a timing based on a timing of the refresh signal AREF. The refresh control circuit 116 may have time slots corresponding to the timing of AREF, and may provide one or more refresh addresses RXADD during each time slot. A targeted refresh address may be issued in a time slot which would otherwise have been assigned to an auto-refresh address (e.g., "steal"). In some embodiments, certain time slots may be reserved for targeted refresh addresses. These time slots may be referred to as a targeted refresh intervals or targeted refresh time slots. The time period between time slots reserved for targeted refresh addresses may be referred to as the targeted refresh rate or steal rate.

In some embodiments, certain targeted refresh time slots may be reserved for refreshing a type of victim word line while other targeted refresh time slots may be reserved for refreshing another type of victim word lines. For example, certain targeted refresh time slots may be reserved for refreshing R+/−1 victim word lines and other targeted refresh time slots may be reserved for refreshing R+/−2 victim word lines. In some embodiments, the steal rates for the targeted refresh time slots for the different types of victim word lines may be different. In some embodiments, the steal rates for the targeted refresh time slots for the different types of victim word lines may be independent of one another.

The refresh control circuit 116 may receive the row addresses XADD provided by the address decoder circuit 104 and may determine which word lines are being hammered based on the row addresses XADD. For example, the refresh control circuit 116 may count accesses to the word lines and may determine which word lines are aggressors based on the count of the accesses (e.g., reach a threshold value). The row addresses XADD and access count values may be stored by the refresh control circuit 116. When an aggressor word line is determined, the refresh control circuit 116 may calculate victim word lines associated with the aggressor word line and perform targeted refresh operations as previously described.

The power supply terminals are supplied with power supply potentials VDD and VSS. The power supply potentials VDD and VSS are supplied to an internal voltage generator circuit 128. The internal voltage generator circuit 128 generates various internal potentials VPP, VOD, VARY, VPERI, and the like based on the power supply potentials VDD and VSS supplied to the power supply terminals. The internal potential VPP is mainly used in the row decoder circuit 108, the internal potentials VOD and VARY are mainly used in the sense amplifiers SAMP included in the memory array 112, and the internal potential VPERI is used in many peripheral circuit blocks.

The power supply terminals are also supplied with power supply potentials VDDQ and VSSQ. The power supply potentials VDDQ and VSSQ are supplied to the input/output circuit 126. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 126 does not propagate to the other circuit blocks.

Figure 2:
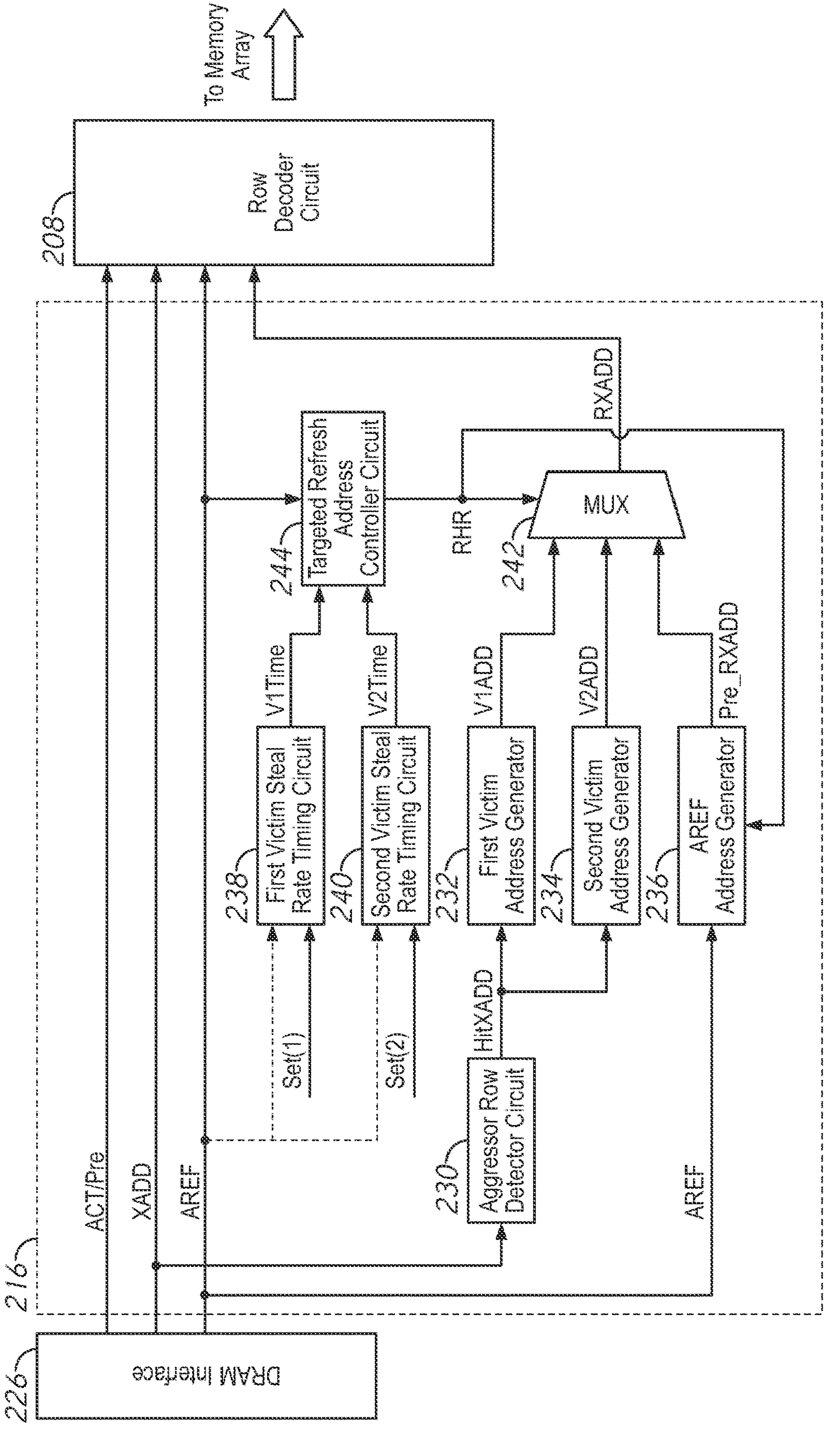
FIG. 2 is a block diagram of a refresh control circuit according to an embodiment of the present disclosure.

FIG. 2 is a block diagram of a refresh control circuit 216 according to an embodiment of the present disclosure. In some embodiments, the refresh control circuit 216 may be included in a memory device, such as memory device 100 shown in FIG. 1. For context, a DRAM interface 226 and a row decoder circuit 208 are also shown in FIG. 2. In some embodiments, refresh control circuit 216 may be included in refresh control circuit 116 shown in FIG. 1. In some embodiments, row decoder circuit 208 may be included in row control circuit 108. In some embodiments, some of the components (e.g., the refresh control circuit 216 and row decoder circuit 208) may be provided for a particular bank of memory and these components may be repeated for each of the banks of memory. Thus, there may be multiple refresh control circuits 216 and row decoder circuits 208 in a memory device. For the sake of brevity, only components for a single bank will be described.

A DRAM interface 226 may provide one or more signals to an address refresh control circuit 216 and row decoder circuit 208. The refresh control circuit 216 may include an aggressor row detector circuit 230, a first victim address generator 232, a second victim address generator 234, an auto-refresh (AREF) address generator 236, a first victim steal rate timing circuit 238, a second victim steal rate timing circuit 240, a multiplexer 242, and a targeted refresh address controller circuit 244. The DRAM interface 226 may provide one or more control signals, such as an auto-refresh signal AREF, an activation/precharge signal ACT/Pre, and a row address XADD.

The DRAM interface 226 may represent one or more components which provides signals to components of a memory bank, such as refresh control circuit 216 and row decoder circuit 208. In some embodiments, the DRAM interface 226 may represent a memory controller coupled to the semiconductor memory device (e.g., device 100 of FIG. 1). In some embodiments, the DRAM interface 226 may represent components such as the command address input circuit 102, the address decoder circuit 104, and/or the command control circuit 106 of FIG. 1. The DRAM interface 226 may provide a row address XADD, the auto-refresh signal AREF, an activation signal ACT, and/or a precharge signal Pre. The auto-refresh signal AREF may be a periodic signal which may indicate when an auto-refresh operation is to occur. The activation signal ACT may be provided to activate a given bank of the memory. The row address XADD may be a signal including multiple bits (which may be transmitted in series or in parallel) and may correspond to a specific row of a memory bank (e.g., the memory bank activated by ACT/Pre).

During a memory operation, the aggressor row detector circuit 230 may receive the current row address XADD. In some embodiments, the aggressor row detector circuit 230 may store the current value of the row address XADD. The aggressor row detector circuit 230 may further store a count value associated with each stored row address. The count value for a row address may be adjusted (e.g., incremented) each time the row address stored in the aggressor row detector circuit 230 is received as XADD.

For each row address XADD stored in the aggressor row detector circuit 230, the aggressor row detector circuit 230 may determine if the current row address XADD is an aggressor row address based on one or more previously stored row addresses. For example, in some embodiments, the aggressor row detector circuit 230 may determine a row address is an aggressor row address based on a number of times the row address XADD is received (e.g., the count value of the stored row address exceeds a threshold value). The aggressor row detector circuit 230 may then reset the count value associated with the aggressor row address. Other aggressor row detection methods may be used in other embodiments. When an aggressor row address is identified, the aggressor row detector circuit 230 may provide the matched address HitXADD to the first victim address generator 232 and the second victim address generator 234 in some embodiments.

The row address XADD may change as the DRAM interface 226 directs access operations (e.g., read and write operations) to different rows of the memory cell array (e.g., memory cell array 118 of FIG. 1). In some embodiments, the aggressor row detector circuit 230 may store every received row address XADD. In other embodiments, the aggressor row detector circuit 230 may store received row addresses responsive to an active sample signal provided by a sample timing generator (not shown). In some embodiments, the sample signal may be a pulse signal. That is, it may transition to an active state and return to an inactive state after a time period (e.g., half a clock cycle, one clock cycle). The sample generator may regularly, randomly, or pseudo-randomly vary a time interval between pulses of the sample signal.

The first victim address generator 232 and the second victim address generator 234 calculate one or more row addresses to be refreshed based on aggressor row addresses identified by the aggressor row detector circuit 230 (e.g, row addresses XADD associated with count values above a threshold value). The row addresses calculated by the first victim address generator 232 and the second victim address generator 234 may be victim row addresses corresponding to victim word lines of an aggressor word line associated with HitXADD. The first victim address generator 232 and the second victim address generator 234 may be provided the match address HitXADD as input. The first victim address generator 232 may provide a targeted refresh address V1ADD and the second victim address generator 234 may provide targeted refresh address V2ADD in response to these inputs. The targeted refresh addresses may be an addresses for a memory location (e.g., a word line) that may be affected by repeated activation of the memory location corresponding to the match address HitXADD. In other words, the match address HitXADD may be an 'aggressor' row address, and the targeted refresh address V1ADD and V2ADD may be a 'victim' addresses. Different calculations may be used for generating different victim addresses as the targeted refresh addresses V1ADD and V2ADD.

The first victim address generator 232 and the second victim address generator 234 may employ different calculations for generating victim row addresses. In one example, a first calculation may be used by the first victim address generator 232, and a second calculation may be used by the second victim address generator 234. The calculations may provide targeted refresh addresses V1ADD or V2ADD corresponding to word lines which have a known physical relationship (e.g., a spatial relationship) with a word line corresponding to the match address HitXADD. In some embodiments, the different calculations may be based on different physical relationships between the victim word line and the aggressor word line. The calculations may result in a single targeted refresh address for V1ADD and/or V2ADD in some embodiments of the disclosure. The calculations may result in a sequence of targeted refresh addresses for V1ADD and/or V2ADD in other embodiments of the disclosure.

In one embodiment, the first calculation may cause the first victim address generator 232 to output a pair of addresses which correspond to word lines that are adjacent to the word line corresponding to the match address HitXADD (e.g., V1ADD=HitXADD+/−1). The second calculation may cause the second victim address generator 234 to output a pair of addresses which correspond to word lines that are adjacent to word lines corresponding to the addresses HitXADD+/−1 (e.g., V2ADD=HitXADD+/−2). In other words, the second calculation may output a pair of addresses that correspond to victim word lines adjacent to the victim word lines corresponding to the addresses V1ADD. Other calculations are possible in other example embodiments. For example, the first calculation may be based on a physical relationship with the match address HitXADD, while the second calculation may be based on a physical relationship with the address(es) provided by the first calculation. The targeted addresses V1ADD and V2ADD calculated by the first victim address generator 232 and the second victim address generator 234 may be provided to a multiplexer 242 in some embodiments. In some embodiments, the first victim address generator 232 and the second victim address generator 234 may include buffers (not shown) for storing victim row addresses to be provided to the multiplexer 242 during subsequent targeted refresh operations.

The AREF address generator 236 generates an auto-refresh address Pre_RXADD in response to the refresh signal AREF. The auto-refresh address Pre_RXADD may be part of a sequence of addresses to be refreshed as part of an auto-refresh operation. The AREF address generator 236 may update the current auto-refresh address Pre_RXADD to a next address in the sequence in response to an active refresh signal AREF. The AREF address generator 236 is also provided the command signal RHR from targeted refresh address controller circuit 244. In some embodiments, when the command signal RHR is active, the AREF address generator 236 may be controlled to stop updating the automatic refresh address Pre_RXADD even if the automatic refresh signal AREF is active. As described herein, since the active command signal RHR indicates that a targeted refresh operation is to be conducted instead of an automatic refresh operation, this allows the automatic refresh operation to be suspended while the targeted refresh is carried out, and resumed when the command signal RHR is not active.

The multiplexer 242 accepts the automatic refresh address Pre_RXADD provided by the AREF address generator 236, V1ADD provided by first victim address generator 232, V2ADD provided by second victim address generator 234, and outputs one of them as the refresh address RXADD. The multiplexer 242 may select between the refresh addresses based on the command signal RHR. Targeted refresh address controller circuit 244 provides an output RHR to the multiplexer 242 to control selection of providing the Pre_RXADD. V1ADD, or V2ADD addresses as the refresh address RXADD.

First victim steal rate timing circuit 238 may provide a timing signal V1Time that may determine a rate at which victim row address V1ADD is provided as RXADD. Second victim steal rate timing circuit 240 may provide a timing signal V2Time that may determine a rate at which victim row address V2ADD is provided as RXADD. Timing signals V1Time and V2Time may be periodic signals that alternate between active and inactive states (e.g., between high and low logic levels). The timing signals V1Time and V2Time may operate at different frequencies in some embodiments. For example, in some embodiments, V1Time may have a higher frequency than V2Time. In these embodiments, this may cause victim row address V1ADD to be provided as RXADD at a higher frequency than V2ADD. The first victim steal rate timing circuit 238 and the second victim steal rate timing circuit 240 may be independent. That is, neither timing circuit requires an input from the other timing circuit to generate its output. In some embodiments, the timing circuits may each receive at least one input unique to the timing circuit such that the timing circuits do not receive completely identical inputs.

The first victim steal rate timing circuit 238 and/or the second victim steal rate timing circuit 240 may include a square wave generating circuit for generating the outputs V1Time and V2Time, respectively. For example, a Schmitt waveform generator, a 555 timer (not shown), and/or a ring-type waveform generator may be included in the first victim steal rate timing circuit 238 and/or the second victim steal rate timing circuit 240. As indicted by Set(1) and Set(2) in FIG. 2, the frequencies of V1Time and/or V2Time may be set by fuses, antifuses, programming one or more mode registers, and/or other frequency setting method. For example, the frequencies may be set by providing a timing control voltage via/responsive to a command signal from the DRAM interface 226 in some embodiments.

Optionally, in some embodiments, the first victim steal rate timing circuit 238 and/or the second victim steal rate timing circuit 240 may receive the AREF signal to synchronize the activation of the V1Time and/or V2Time with the AREF signal. This may help ensure that the V1Time and/or V2Time signals are activated during refresh operations rather than between refresh operations when the timing signals may be ignored.

The targeted refresh address controller circuit 244 may receive V1Time, V2Time, and AREF as inputs and provide control signal RHR based on these inputs. Targeted refresh address controller circuit 244 may include logic gates and/or other circuitry to generate control signal RHR. Control signal RHR may have multiple states in some embodiments. In some embodiments, control signal RHR may be a multi-bit signal with multiple states (e.g., '00', '01,' '10,' '11'). For example, RHR may have a first state when AREF is inactive, regardless of the states of V1Time and V2Time, a second state when AREF is active and V1Time is active, a third state when AREF is active and V2Time is active, and a fourth state when AREF is active and neither V1Time nor V2Time are inactive. In some embodiments. V1Time and V2Time may be prohibited from being active at the same time. In some embodiments, the targeted refresh address controller circuit 244 may favor one timing signal over another. For example, if both V1Time and V2Time are active, targeted refresh address control circuit 244 may favor V1Time and provide RHR in the second state.

In some embodiments, the multiplexer 242 may provide V1ADD as RXADD when RHR is in a state indicating AREF and V1Time are active, provide V2ADD as RXADD when RHR is in a state indicating AREF and V2Time are active, and provide Pre_RXADD when RHR is in a state indicating only AREF is active. When AREF is inactive, no address may be provided as RXADD and/or the row decoder circuit 208 may ignore RXADD when AREF is inactive.

The row decoder circuit 208 may perform one or more operations on the memory array (not shown) based on the received signals and addresses. For example, responsive to the activation signal ACT and the row address XADD (and AREF being at a low logic level), the row decoder circuit 208 may direct one or more access operations (for example, a read operation) on the specified row address XADD. Responsive to the AREF signal being active, the row decoder circuit 208 may refresh the refresh address RXADD.

Although the example illustrated in FIG. 2 shows two victim steal rate timing circuits and two victim address generators, it is understood that additional victim steal rate timing circuits and victim address generators may be included in other embodiments. For example, it may be desirable to have separate steal rate timing for additional victim word line types (e.g., R+/−3, R+/−4) and perform targeted refresh operations on these additional victim word lines.

Figure 3:
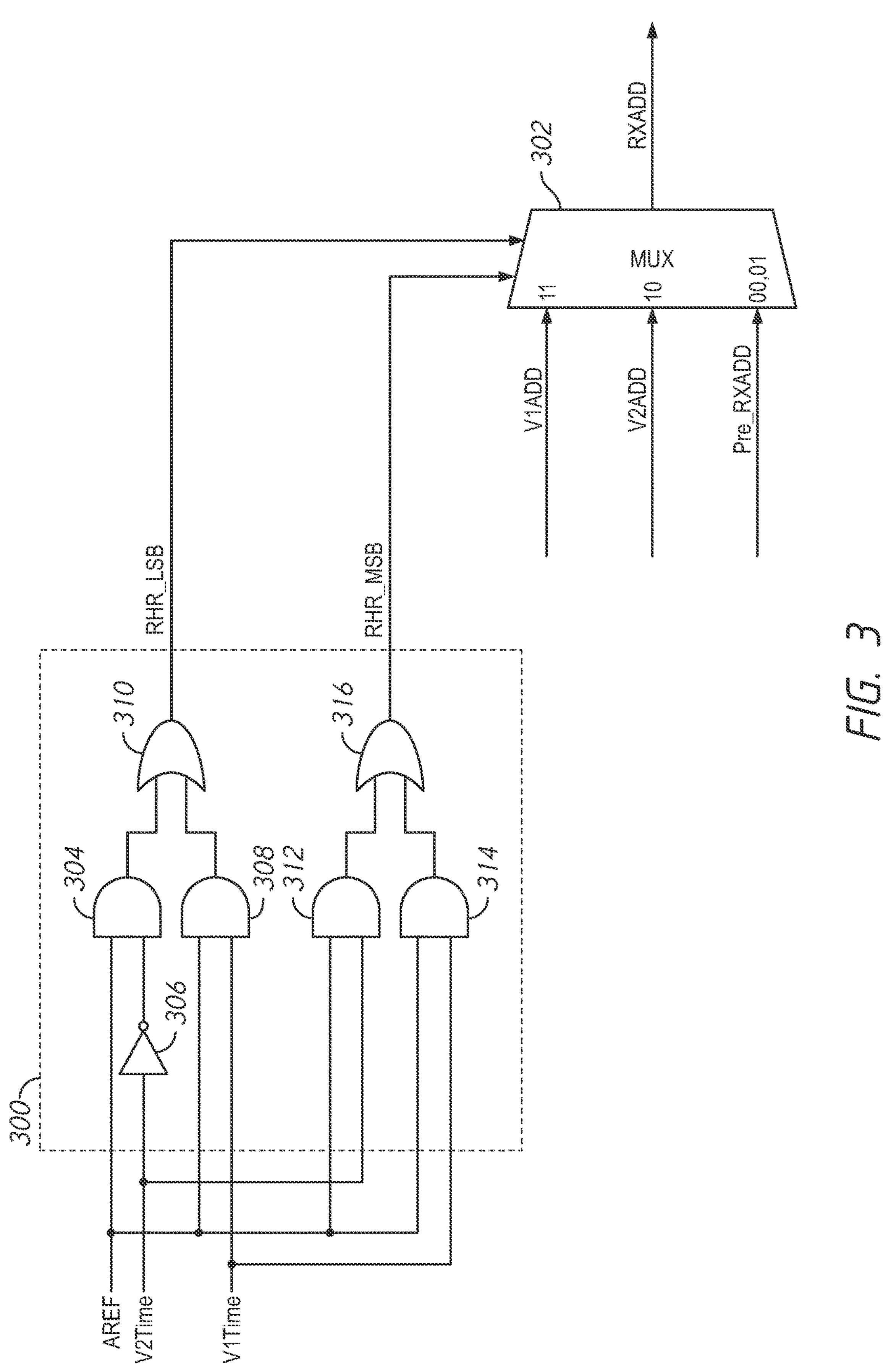
FIG. 3 is a circuit diagram of an example targeted refresh address controller circuit according to an embodiment of the present disclosure.

FIG. 3 is a circuit diagram of an example targeted refresh address controller circuit 300 according to an embodiment of the present disclosure. In some embodiments, the targeted refresh address controller circuit 300 may be included in targeted refresh address controller circuit 244 shown in FIG. 2. For context, a multiplexer 302 is also shown in FIG. 3. Multiplexer 302 may be included in multiplexer 242 shown in FIG. 2 in some embodiments.

The targeted refresh address controller circuit 300 may receive refresh signal AREF, a first timing signal V1Time, and a second timing signal V2Time. In some embodiments, the refresh signal AREF may be provided by a command control circuit such as command control circuit 106 shown in FIG. 1. In some embodiments, the refresh signal AREF may be provided via a DRAM interface such as DRAM interface 226 shown in FIG. 2. In some embodiments, the first timing signal V1Time and/or the second timing signal V2Time may be provided by victim steal rate timing circuits, such as first victim steal rate timing circuit 238 and second victim steal rate timing circuit 240 shown in FIG. 2. Based on the refresh signal AREF and timing signals V1Time and V2Time, the targeted refresh address controller circuit 300 may provide control signal RHR to the multiplexer 302. The state of the control signal RHR may determine what row address is provided as the refresh address RXADD. In the example shown in FIG. 3, the control signal RHR is a two-bit signal including a least significant bit RHR_LSB and a most significant bit RHR_MSB.

The multiplexer 302 may provide a first victim row address V1ADD, a second victim row address V2ADD, or an auto-refresh address Pre-RXADD as RXADD depending on the state of the RHR signal. In some embodiments, the first victim row address V1ADD and/or second victim row address V2ADD may be provided by victim row address generators, such as first victim row address generator 232 and second victim row address generator 234 shown in FIG. 2. In some embodiments, the auto-refresh address Pre_RXADD may be provided by an auto-refresh address generator, such as AREF address generator 236 shown in FIG. 2. In some embodiments, the first victim row address V1ADD may include one or more victim row addresses that correspond to one or more victim word lines having a first physical relationship to an aggressor word line. In some embodiments, the second victim row address V2ADD may include one or more victim row addresses that correspond to one or more victim word lines having a second physical relationship to the aggressor word line. For example, the first victim row address V1ADD may correspond to victim word lines physically adjacent to the aggressor word line and the second victim row address V2ADD may correspond to victim word lines physically adjacent to the victim word lines corresponding to V1ADD.

In some embodiments, the targeted refresh address controller circuit 300 may include a first AND gate 304 that receives the AREF signal at a first input and an inverted V2Time signal at a second input. The V2Time signal may be inverted by inverter 306. A second AND gate 308 may receive the AREF signal and the V1Time signal at its inputs. The outputs of the first AND gate 304 and the second AND gate 308 may be provided to a first OR gate 310. Based on the inputs, the first OR gate 310 may output RHR_LSB. The targeted refresh address controller circuit 300 may include a third AND gate 312 that receives AREF and V2Time signals as inputs. A fourth AND gate 314 may receive the AREF and V1Time signals as inputs. The outputs of the third AND gate 312 and the fourth AND gate 314 may be provided to a second OR gate 316. The OR gate 316 may provide RHR_MSB as an output.

In the example shown in FIG. 3, the multiplexer 302 is configured to provide Pre_RXADD when RHR is in state '00' or '01,' provide V2ADD when RHR is in state '10,' and provide V1ADD when RHR is in state '11.' In operation, the targeted refresh address controller circuit 300 provides RHR in state '00' when AREF is inactive (e.g., logic low) regardless of the states of V1Time and V2Time. Although the multiplexer 302 may provide Pre_RXADD as RXADD in this state, as mentioned previously, it may be ignored by a row decoder circuit since a refresh operation is not occurring. When AREF is active (e.g., logic high) and V1Time and V2Time are inactive. RHR is in state '01.' In response, the multiplexer 302 may provide Pre_RXADD as RXADD, which may be received by a row decoder circuit for use during a refresh operation. When AREF and V1Time are active and V2Time is inactive, RHR is in state '11' and the multiplexer 302 provides victim row address V1ADD as RXADD. When AREF and V2Time are active and V1Time is inactive. RHR is in state '10' and the multiplexer 302 provides victim row address V2ADD as RXADD.

In the example shown in FIG. 3, when AREF. V1Time, and V2Time are all active. RHR is in a state '11' and V1ADD is provided as RXADD. Thus, in the event of a conflict between V1Time and V2Time, the victim word lines associated with V1ADD are favored for refreshing over word lines associated with V2ADD. This may be desirable if, as in the example described above, the word lines associated with V1ADD are in closer physical proximity to the aggressor word line than word lines associated with V2ADD. However, in other embodiments, alternative logic gates may be provided to favor word lines associated with V2ADD over word lines associated with V1ADD when there is a conflict between V1Time and V2Time. In other embodiments, additional circuitry and/or logic gates may be provided that prevent V1Time and V2Time from being active at the same time.

Although not shown in FIG. 3, in some embodiments, RHR_MSB may be provided to an auto-refresh address generator, such as AREF address generator 236 shown in FIG. 2. The auto-refresh address generator may use the RHR_MSB signal to pause the generation of auto-refresh addresses during targeted refresh address operations as discussed previously with reference to FIG. 2.

Figure 4:
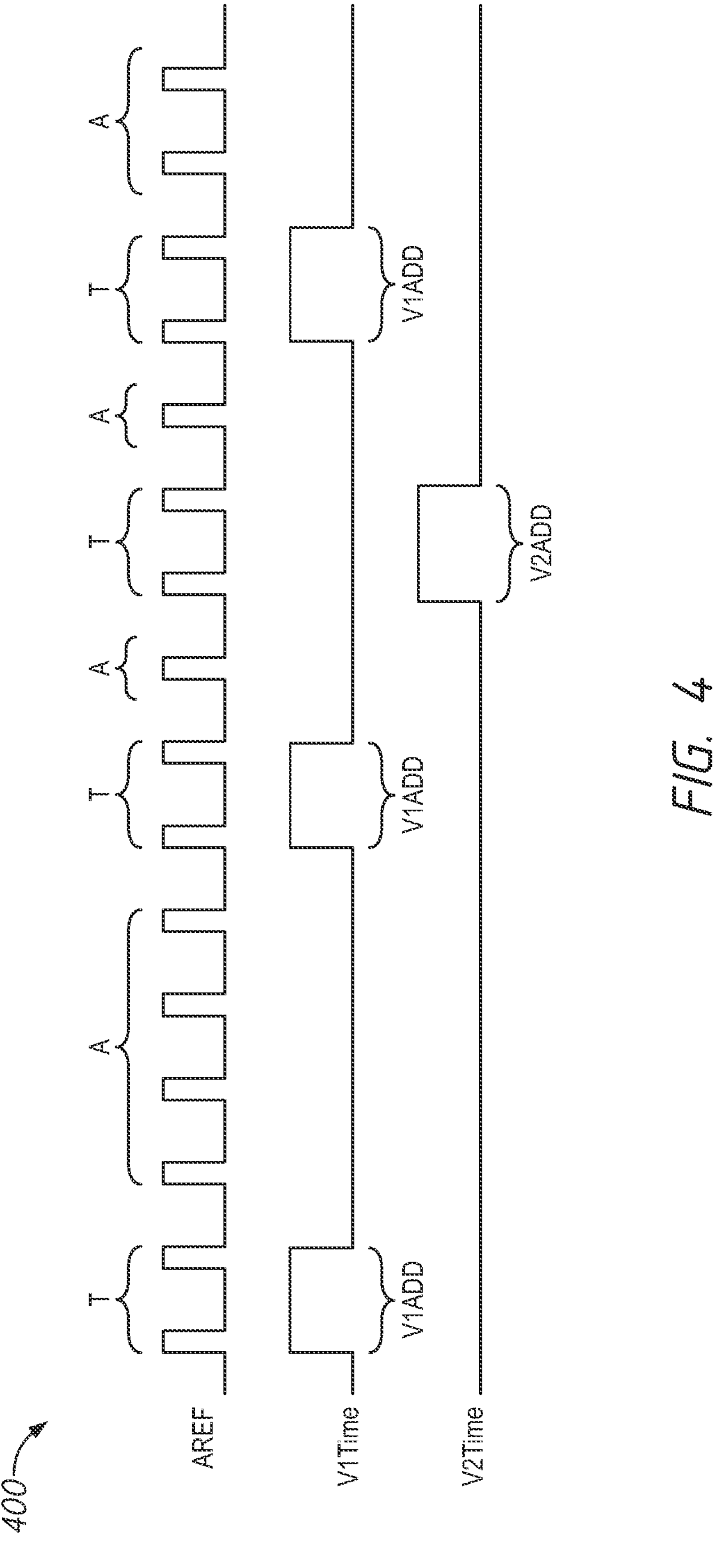
FIG. 4 is an example timing diagram of a refresh signal, a first timing signal, and a second timing signal in accordance with an embodiment of the present disclosure.

FIG. 4 is an example timing diagram of a refresh signal, a first timing signal, and a second timing signal in accordance with an embodiment of the present disclosure. Timing diagram 400 shows refresh signal AREF, first timing signal V1Time, and second timing signal V2Time. In some embodiments, the refresh signal AREF may be provided by a command control circuit such as command control circuit 106 shown in FIG. 1. In some embodiments, the refresh signal AREF may be provided via a DRAM interface such as DRAM interface 226 shown in FIG. 2. In some embodiments, the first timing signal V1Time and/or the second timing signal V2Time may be provided by victim steal rate timing circuits, such as first victim steal rate timing circuit 238 and second victim steal rate timing circuit 240 shown in FIG. 2. AREF, V1Time, and V2Time may be used to control a targeted refresh address controller circuit, such as targeted refresh address controller circuit 244 shown in FIG. 2 or targeted refresh address controller circuit 300 shown in FIG. 3. Other components of a refresh control circuit, such as refresh control circuit 116 shown in FIG. 1 or refresh control circuit 216 shown in FIG. 2, may receive AREF, V1Time, and/or V2Time in some embodiments.

The timing diagram 400 as shown displays the state of the signals for a refresh control circuit which refreshes first victim word lines at a first rate based off of the rate of timing signal V1Time, and second victim word lines refreshed at a second rate based off of the rate of timing signal V2Time. In this example, the first victim word lines are a pair of word lines adjacent to an aggressor word line. The first victim word lines may be associated with a victim row address V1ADD. The second victim word lines are a pair of word lines which are each adjacent to one of the first victim word lines. The second victim word lines may be associated with a victim row address V2ADD. Other circuits may employ other operations wherein, for example, neither set of word lines are adjacent to the aggressor word line.

Figure 6:
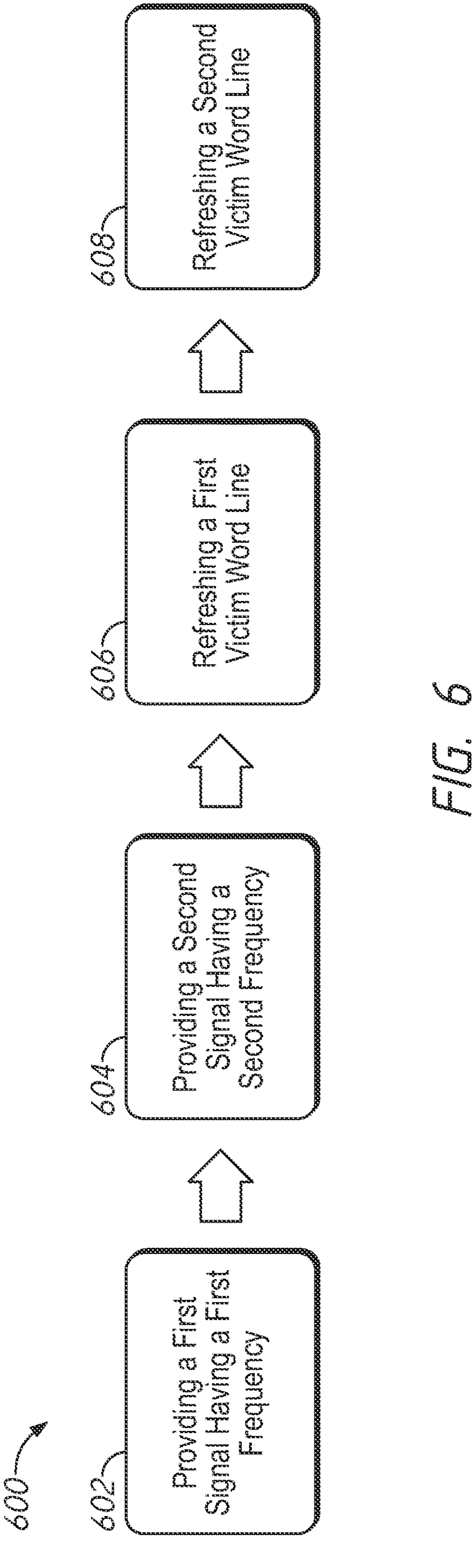
FIG. 6 is a flow chart of a method according to an embodiment of the present disclosure.

The first two line of FIG. 6 shows a portion of the refresh signal AREF. The refresh signal AREF may be a sequence of pulses (e.g., from a low to a high logic level for a set duration). The refresh signal AREF may occur in a set pattern, at regular intervals in time. The refresh signal AREF may control refresh operations, which refreshes one or more word lines of a memory. As discussed herein, the refresh signal AREF may be used to trigger a refresh operation in the memory. As shown, some of the individual pulses have been labeled "T" or "A" to indicate that a targeted refresh operation or an auto-refresh operation is being conducted, respectively, during the period when that particular AREF pulse is active.

The second line of FIG. 4 shows first timing signal V1Time. As shown, the first command signal V1Time is a periodic pulse signal. The first timing signal V1Time may have a duration longer than the duration of each of the pulses of the refresh signal AREF in some embodiments. In this example, the first timing signal V1Time indicates that word lines adjacent to an aggressor word line are to be refreshed (e.g., the refreshed addresses are V1ADD). When the first timing signal V1Time is active, a first activation of refresh signal AREF will instead refresh a first adjacent victim word line (e.g., R+1), and the second activation of refresh signal AREF will refresh a second adjacent victim word line (e.g., R−1).

The third line of FIG. 4 shows second timing signal V2Time. As shown, the second timing signal V2Time may also be a periodic pulse signal. In the example shown in FIG. 4, the frequency of second timing signal V2Time is different than the frequency of first timing signal V1Time. The pulse of the second timing signal V2Time may have a duration equal to a duration of the pulse of the first timing signal V1Time in some embodiments. In this example, the second timing signal V2Time indicates that word lines adjacent to the victim word lines adjacent to the aggressor word line are to be refreshed (e.g., the refreshed addresses are V2ADD). When the second timing signal V2Time is active, a first activation of refresh signal AREF will instead refresh a first victim word line (e.g., R+2), and the second activation of refresh signal AREF will refresh a second victim word line (e.g., R−2).

Figure 5:
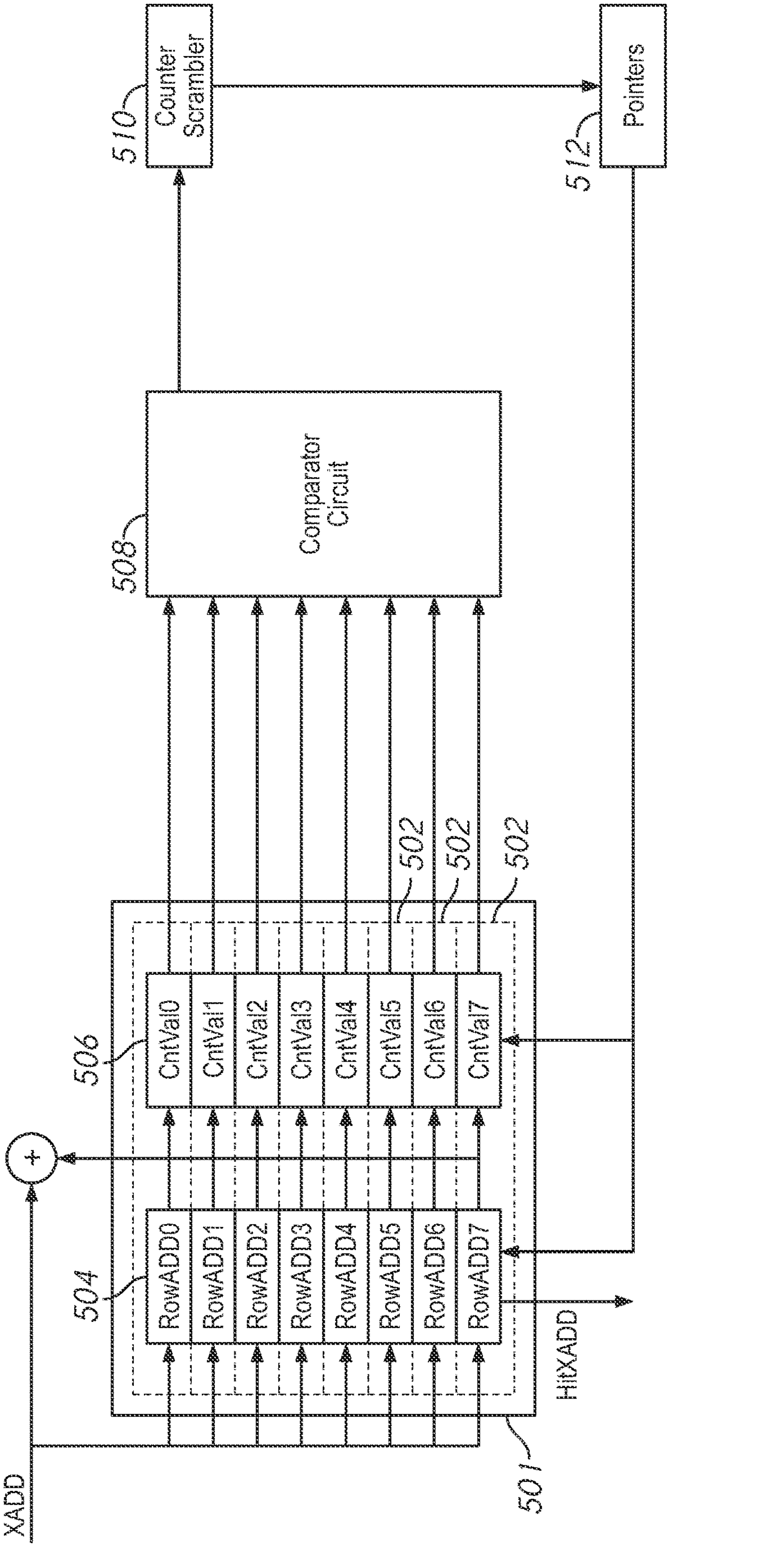
FIG. 5 is an example aggressor row detector circuit according to an embodiment of the present disclosure.

FIG. 5 is an example aggressor row detector circuit 500 according to an embodiment of the present disclosure. In some embodiments, aggressor row detector circuit 500 may be included in aggressor row decoder circuit 230 shown in FIG. 2. However, in other embodiments, other aggressor row detector circuits may be included in aggressor row decoder circuit 230. The aggressor row detector circuit 500 may include a stack 501. The stack 501 may be a content addressable memory (CAM) stack in some embodiments. The stack 501 may include multiple registers (e.g., files) 502, each of which may have corresponding fields 504, 506. In the embodiment shown in FIG. 5, each register includes a field 504 configured to store a row address (RowADD0-7) and a field 506 configured to store a corresponding count value (ACntVal0-7). The fields 506 storing the count values may be coupled to a comparator 508 which may be coupled to pointers 512 through a counter scrambler 510. In some embodiments, the fields 504 storing row addresses may be coupled to one or more victim address generators (not shown in FIG. 5), such first victim address generator 232 and/or second victim address generator 234 shown in FIG. 2, and provide a matched address HitXADD to the victim address generators. While the example in FIG. 5 shows eight registers 502 in the stack 501, it is understood that the stack could include fewer or more registers. For example, the stack 501 could have 128 registers. In another example, the stack 501 could have 1,024 registers.

Each time a row address XADD is provided to the registers 502, the row address XADD may be compared to the fields 504. If the current row address XADD is already stored in one of the registers 502, then the count value in field 506 associated with the matching row address in field 504 may be adjusted (e.g., increased). If the current row address XADD is not already stored in one of the registers 502, it may be added to the registers 502. If there is an open register (e.g., a register without a row address) then the row address XADD may be stored in the open register. If there is not an open register, then the register 502 associated with the count value which has the lowest value (as indicated by the pointers 512) may have its row address replaced with the current row address XADD and count value reset.

The comparator 508 may compare the count values in fields 506 to a threshold value to determine if a count value for a row address has matched or exceeded the threshold value (e.g., 2,000, 3,000, 5,000). In some embodiments, the comparator 508 may further compare the count values to determine which row address is associated with the lowest count value. The fields 506 corresponding to the minimum count value and count values that meet or exceed the threshold value may be provided to a counter scrambler 510, which may match the above threshold value fields and minimum count value field to their respective associated row address fields 504. The pointers 512 may point to the row addresses in fields 504 associated with count values at or above the threshold value and may point to the fields 504 associated with the minimum count value in fields 506. The threshold value pointer(s) may be used to reset the counts of the row addresses determined to be aggressors. In some embodiments, the threshold value pointer(s) may be used to provide the corresponding row address(es) to the victim address generators as HitXADD. The minimum count value pointer may be used to overwrite a register 502 when a new row address XADD is received and there is no open register 502 to store it in.

FIG. 6 is a flow chart 600 of a method according to an embodiment of the present disclosure. At block 602, a step of "providing a first signal having a first frequency" may be performed. In some embodiments, the first signal may be generated by a victim steal rate timing circuit, such as first victim steal rate timing circuit 238 shown in FIG. 2. At block 604, a step of "providing a second signal having a second frequency" may be performed. In some embodiments, the second signal may be generated by a victim steal rate timing circuit, such as second victim steal rate timing circuit 240 shown in FIG. 2. In some embodiments, the second frequency is independent of the first frequency. In some embodiments, the second frequency is different than the first frequency. At block 606, a step of "refreshing a first victim word line" may be performed. In some embodiments, the refreshing may be based, at least in part, on the first frequency. At block 608, a step of "refreshing a second victim word line" may be performed. In some embodiments, the refreshing may be based, at least in part, on the second frequency.

In some embodiments, the method shown in flow chart 600 may further include generating a control signal based, at least in part, on the first signal and the second signal. In some embodiments, the control signal may be generated by a targeted refresh address controller circuit, such as targeted refresh address controller circuit 244 shown in FIG. 2 or targeted refresh address controller circuit 300 shown in FIG. 3. In some embodiments, the method shown in flow chart 600 may further include providing a refresh address for refreshing a word line based, at least in part, on the control signal, wherein the refresh address is the first victim word line or the second victim word line. In some embodiments, the refresh address may be provided by a multiplexer, such as multiplexer 242 shown in FIG. 2 or multiplexer 302 shown in FIG. 3.

The apparatuses and methods described herein may allow for independently controlling the steal rates for different victim word lines, such as victim word lines that have different physical distances from an aggressor word line. In some embodiments, a refresh control circuit may include two or more timing circuits to allow independent control of the steal rates for different victim word lines. This may allow the targeted refresh rates for each type of victim word line to be optimized, which may reduce over-refreshing of the word lines.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A memory device, comprising:

a memory array comprising a plurality of word lines, wherein at least one word line of the plurality of word lines is an aggressor row;

a refresh control circuit comprising:

a first victim address generator configured to generate a first type of row address corresponding to +/−1 physically adjacent neighboring rows of the aggressor row in the memory array;

a second victim address generator configured to generate a second type of row address corresponding to +/−2 physically adjacent neighboring rows of the aggressor row in the memory array, wherein the refresh control circuit is configured to provide the first type of row address at a first rate and the second type of row address at a second rate, wherein the first rate is greater than the second rate; and at least one component configured to set the first rate and second rate.

2. The memory device of claim 1, wherein the component comprises a mode register.

3. The memory device of claim 1, wherein the mode register is set responsive to a command signal.

4. The memory device of claim 1, wherein the component comprises a fuse or antifuse.

5. The memory device of claim 1, wherein the first and second rates are independent of each other.

6. The memory device of claim 1, wherein the refresh control circuit is further configured to provide a third type of row address for auto-refresh operations.

7. A method, comprising:

receiving a refresh command at a memory device:

generating, with a refresh control circuit, a first victim row address corresponding to a first victim row in a memory array of the memory device based, at least in part, on an aggressor row in the memory array;

refreshing the first victim row at a first rate;

generating, with the refresh control circuit a second victim row address corresponding to a second victim row in the memory array based, at least in part, on the aggressor row in the memory array;

refreshing the second victim row at a second rate;

generating, with the refresh control circuit, row addresses corresponding to rows in the memory array; and auto-refreshing the rows in the memory array at a third rate.

8. The method of claim 7, further comprising setting the first rate and the second rate.

9. The method of claim 8, wherein setting the first rate and the second rate comprises writing a value to a mode register.

10. The method of claim 8, wherein setting the first rate and the second rate comprises setting a fuse or an antifuse.

11. The method of claim 7, wherein the first victim row has a first physical relationship to the aggressor row, and the second victim row has a second physical relationship to the aggressor row.

12. The method of claim 11, further comprising refreshing at a third rate, a third victim row having a third physical relationship to the aggressor row.

13. The method of claim 7, wherein generating the first victim row address and the second victim row address comprises determining the first victim row and the second victim row based on a row address of the aggressor row.

14. The method of claim 7, wherein the first rate is greater than the second rate.

15. An apparatus comprising:

a memory array comprising a plurality of word lines, wherein at least one word line of the plurality of word lines is an aggressor row;

a refresh control circuit comprising at least one victim address generator configured to generate a plurality of types of row addresses corresponding to the plurality of word lines, wherein the refresh control circuit is configured to provide the plurality of types of row addresses for refresh operations performed at corresponding ones of a plurality of rates on the plurality of word lines of the memory array; and a row decoder configured to perform the refresh operations based on row addresses provided from the refresh control circuit, wherein word lines corresponding to a first type of row addresses of the plurality of types of row addresses are refreshed at a first rate of the plurality of rates and word lines corresponding to a second type of row addresses of the plurality of types of row addresses are refreshed at a second rate of the plurality of rates, wherein word lines associated with the first type of row addresses have a first physical relationship with the aggressor row and word lines associated with the second type of row addresses have a second physical relationship with the aggressor row; and at least one component configured to set the plurality of rates.

16. The apparatus of claim 15, wherein at least one of the plurality of rates is different than another one of the plurality of rates.

17. The apparatus of claim 16, wherein the plurality of rates are independent.

18. The apparatus of claim 15, wherein the first rate of the plurality of frequencies is higher than the second rate.

19. The apparatus of claim 15, wherein the first type of row addresses correspond to +/−1 physically adjacent neighboring rows and are refreshed at the first rate of the plurality of rate and the second type of row addresses correspond to +/−2 physically adjacent neighboring rows and are refreshed at the second rate that is lower than the first rate.

* * * * *